US009013206B2

(12) United States Patent
Muller et al.

(10) Patent No.: US 9,013,206 B2
(45) Date of Patent: Apr. 21, 2015

(54) PLUG-IN ELECTRIC VEHICLE SUPPLY EQUIPMENT HAVING A PROCESS AND DEVICE FOR CIRCUIT TESTING

(75) Inventors: Michael Muller, Harper Woods, MI (US); Charles K. Yankitis, New Baltimore, MI (US); David P. Futkos, Willoughby, OH (US); Matthew C. Schuping, Concord Twp., OH (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 276 days.

(21) Appl. No.: 13/485,116

(22) Filed: May 31, 2012
(Under 37 CFR 1.47)

(65) Prior Publication Data
US 2013/0321024 A1  Dec. 5, 2013

(51) Int. Cl.
*G01R 31/40* (2014.01)
*G01R 31/327* (2006.01)
*B60L 1/00* (2006.01)
*B60L 3/00* (2006.01)
*B60L 3/04* (2006.01)
*B60L 11/18* (2006.01)

(52) U.S. Cl.
CPC .............. *G01R 31/40* (2013.01); *G01R 31/327* (2013.01); *B60L 1/003* (2013.01); *B60L 3/0069* (2013.01); *B60L 3/04* (2013.01); *B60L 11/1816* (2013.01); *B60L 11/1846* (2013.01); *B60L 2230/12* (2013.01); *B60L 2230/16* (2013.01); *B60L 2230/22* (2013.01); *B60L 2230/24* (2013.01); *B60L 2240/34* (2013.01); *B60L 2240/80* (2013.01)

(58) Field of Classification Search
USPC .................................................... 324/764.01
See application file for complete search history.

(56) References Cited

U.S. PATENT DOCUMENTS

| 4,820,187 | A |   | 4/1989  | May    |         |
|-----------|---|---|---------|--------|---------|
| 5,357,087 | A | * | 10/1994 | Choi   | 219/721 |
| 5,462,439 | A |   | 10/1995 | Keith  |         |
| 5,548,200 | A | * | 8/1996  | Nor et al. | 320/109 |
| 5,563,491 | A | * | 10/1996 | Tseng  | 320/109 |

(Continued)

FOREIGN PATENT DOCUMENTS

WO      2010055411 A1     5/2010

OTHER PUBLICATIONS

International Search Report & Written Opinion for PCT/US2011/066380, prepared Jun. 13, 2012.

(Continued)

*Primary Examiner* — Benjamin M Baldridge
(74) *Attorney, Agent, or Firm* — Baker & Hostetler LLP (57) ABSTRACT

A system for connecting an electric vehicle to a high voltage power source is disclosed. The system including an electric vehicle supply equipment (EVSE) having an electrical plug compatible with a high voltage power outlet, the plug connected to a power cord. The power cord is connected to a housing containing a number of electrical components configured to control the power flow to an electric vehicle to recharge the vehicle's batteries. The power cord extends from the housing and is connected to a standard electric vehicle connector compatible with battery electric vehicles (BEV) and plug-in hybrid electric vehicles (PHEV). The EVSE further includes safety measures, such as a relay that controls the flow of power to the vehicle connector, a ground fault interrupter, and a circuit tester to protect users from high voltage electric shocks.

13 Claims, 4 Drawing Sheets

(56) References Cited

U.S. PATENT DOCUMENTS

| | | | |
|---|---|---|---|
| 5,721,481 A | 2/1998 | Narita et al. | |
| 5,803,215 A * | 9/1998 | Henze et al. | 191/2 |
| 6,198,251 B1 * | 3/2001 | Landon | 320/124 |
| 6,316,908 B2 | 11/2001 | Kajiura | |
| 6,483,272 B1 | 11/2002 | Terada et al. | |
| 6,833,683 B2 | 12/2004 | Winkler | |
| 6,951,206 B2 | 10/2005 | Kishimoto | |
| 7,253,584 B2 | 8/2007 | Souther et al. | |
| 7,254,468 B2 | 8/2007 | Pillar et al. | |
| 7,579,807 B2 | 8/2009 | Funabashi et al. | |
| 7,690,453 B2 | 4/2010 | Kinoshita et al. | |
| 8,085,034 B2 | 12/2011 | Sirton | |
| 8,111,043 B2 | 2/2012 | Redmann | |
| 8,143,842 B2 * | 3/2012 | Tyler et al. | 320/104 |
| 8,151,916 B2 * | 4/2012 | Gearhart | 180/65.265 |
| 8,299,754 B2 | 10/2012 | Hayashigawa et al. | |
| 2007/0035898 A1 * | 2/2007 | Baldwin et al. | 361/42 |
| 2007/0279814 A1 * | 12/2007 | Bonilla et al. | 361/42 |
| 2008/0002314 A1 * | 1/2008 | Batko et al. | 361/42 |
| 2008/0015795 A1 * | 1/2008 | Hofmeister et al. | 702/34 |
| 2009/0313098 A1 | 12/2009 | Hafner et al. | |
| 2010/0017249 A1 | 1/2010 | Fincham et al. | |
| 2010/0174667 A1 * | 7/2010 | Vitale et al. | 705/412 |
| 2010/0241560 A1 | 9/2010 | Landau-Holdsworth et al. | |
| 2010/0268406 A1 | 10/2010 | Ito et al. | |
| 2010/0301802 A1 * | 12/2010 | Iida | 320/109 |
| 2011/0029146 A1 * | 2/2011 | Muller et al. | 700/293 |
| 2011/0074351 A1 | 3/2011 | Bianco et al. | |
| 2011/0144823 A1 * | 6/2011 | Muller et al. | 700/297 |
| 2011/0169447 A1 * | 7/2011 | Brown et al. | 320/109 |
| 2011/0300753 A1 * | 12/2011 | Ichikawa et al. | 439/620.21 |
| 2011/0320056 A1 * | 12/2011 | Brown et al. | 700/295 |
| 2012/0109797 A1 * | 5/2012 | Shelton et al. | 705/34 |
| 2012/0133326 A1 * | 5/2012 | Ichikawa et al. | 320/109 |

OTHER PUBLICATIONS

Robert Krause, et al., "Solid-State Relays Simplify Monitoring Electric-Car Battery Voltage," EDN, Feb. 19, 2004, 83-84.

International Search Report issued in PCT/US2013/043503 dated Dec. 23, 2013.

International Search Report & Written Opinion for PCT/US2012/040462, mailed Aug. 27, 2012.

* cited by examiner

PLUG-IN ELECTRIC VEHICLE SUPPLY EQUIPMENT HAVING A PROCESS AND DEVICE FOR CIRCUIT TESTING

FIELD OF THE INVENTION

The invention relates generally to a process and device for testing the circuits in devices that provide power to recharge the batteries of battery electric vehicles and plug-in hybrid electric vehicles. More particularly, the invention relates generally to a process and device for testing the relays in devices that provide power to recharge the batteries of battery electric vehicles and plug-in hybrid electric vehicles.

BACKGROUND OF THE INVENTION

Vehicles powered either fully or partially by batteries must at some point recharge the batteries. Particularly in the case of battery electric vehicles, the lack of an alternative power source, like one that a plug-in hybrid electric vehicle would have, causes the batteries to deplete faster and have a more limited range. Plug-in electric hybrids are generally less taxing on the batteries and built-in regenerative systems may suffice to recharge the batteries enough to go longer without having to plug-in the vehicle to recharge it.

The standard American electrical socket provides 120 volts A/C. This electricity supply is often insufficient to recharge the batteries of an electric vehicle in a period of time to allow for convenient use of the electric vehicle. A full recharge may not even be completed overnight and partial recharges often take too much time to be practical. Providing a higher voltage electricity supply can greatly reduce the amount of time needed to recharge an electric vehicle. Such high voltage sources are available in homes and other locations.

It is desirable to provide a convenient way of connecting the high voltage electricity source to an electric vehicle to recharge the batteries thereby making recharging quicker and using an electric vehicle more practical. It is also desirable to provide a convenient way to plug the electric vehicle supply equipment to a 220/240V electrical supply source using plugs and receptacles designed to meet National Electrical Manufacturers Association (NEMA) standards. This will reduce the cost of the product, installation, service repair, relocation and greatly simplifying the local electrical permitting process. This will also make the electric vehicle more practical, acceptable and provide a lower cost of ownership for the vehicle consumer.

It is further desirable that when using electric vehicle supply equipment with a 220/240V electrical supply that certain aspects of the circuit include self-testing capability to ensure a safer performance. The self-testing capability may include testing the relay circuits that connect and disconnect the power source to the electrical vehicle.

SUMMARY OF THE INVENTION

At least in view of the above, it would be desirable to provide a system for connecting a high voltage electricity source to an electric vehicle to recharge its batteries that provides a manner in which the electric vehicle supply equipment includes testing circuits. The foregoing needs are met, to a great extent, by certain embodiments of the invention. According to one such embodiment of the invention, an apparatus for connecting an electric vehicle to a high voltage power source includes a plug for use with a high voltage electrical socket attached to power conduit. The power conduit is further connected to a relay, a ground device or current monitor, a control circuit, and a vehicle connector conduit. A processor is connected to the control circuit for sending and receiving signals and data.

In one embodiment, an apparatus for connecting an electric vehicle to an electrical socket, includes a socket connector configured to couple with the electrical socket, a power conduit connected to the socket connector and configured to convey a voltage from the electrical socket, a power control device connected to the power conduit and configured to control the delivery of power through the power conduit, a vehicle connector connected to the power conduit configured to connect to the electric vehicle, a sensor configured to sense voltage, current, or configuration of the power control device, and a processor configured to test at least the power control device and determine functioning of the power control device based on an output of the sensor.

In yet another embodiment, an apparatus for connecting an electric vehicle to a high voltage electrical power is provided and includes means for coupling with the high voltage electrical socket, means for conveying a current from the high voltage electrical socket that is connected to the means for coupling, means for controlling current flow or magnitude along the means for conveying the current, means for interrupting the flow of current to prevent electric shock, means for connecting to the electric vehicle that is connected to the means for conveying the current, means for sensing at least one of voltage, current, or configuration of the means for controlling, and means for testing at least the means for controlling and determining functioning of the means for controlling based on the means for sensing.

In a further embodiment, a method of charging an electrical vehicle is provided and include the steps of receiving a high electrical voltage from a power source, conducting the voltage from the power source to the electrical vehicle via a power conduit, controlling the voltage flowing on the power conduit with a switching relay, cutting power to the electrical vehicle with a breaker circuit, sensing at least one of voltage, current, or configuration associated with the switching relay, testing the switching relay and determining functioning of the switching relay based on the sensing.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the invention. It is important, therefore, that the claims be regarded as including such equivalent constructions insofar as they do not depart from the spirit and scope of the invention.

DETAILED DESCRIPTION

An embodiment of the inventive system for connecting an electric vehicle, such as a battery electric vehicle (BEV) or a plug-in hybrid electric vehicle (PHEV), to a high voltage electricity source may include an apparatus for connecting the electric vehicle to a power source, or an electric vehicle supply equipment (EVSE). The EVSE may be employed to make a circuit connection to allow power from an electrical socket, like a wall socket, to flow to a charging circuit within the electric vehicle. The wall socket may be in a house or at a powering station outside the house. The power station may be positioned, for example, at a parking garage, at a public parking space, at a rest stop, a conventional gas station, or a power station. Further, the EVSE may be constructed to at least meet industry standards, such as SAE J1772, UL 2594, and NEC Article 625. The SAE J2836 vehicle communication standard may also be considered in constructing the EVSE.

The EVSE may have a socket connector at a first end to couple the EVSE to the electrical socket, such as a wall socket, and a vehicle connector at a second end to couple the EVSE to the electric vehicle. Once coupled, to both the wall socket and the vehicle, the EVSE may allow passage of electrical current from the wall socket to the electric vehicle, thus recharging the electric vehicles' batteries. This embodiment allows for the use of standard electrical outlets instead of hardwiring the EVSE to a power source.

In addition, the EVSE may analyze signals and/or data received from the electric vehicle. Analyzing the signals and/or data may involve checking the electric vehicle for specific conditions. While analyzing, the EVSE may determine when to allow and when to prohibit the flow of current between the socket and the electric vehicle.

Finally, the EVSE may include a circuit in which to test various aspects of the EVSE. The various aspects may include, in particular, the relay of the EVSE to ensure that the relay is fully operational.

The invention will now be described with reference to the drawing figures, in which like reference numerals refer to like parts throughout.

Figure 1:
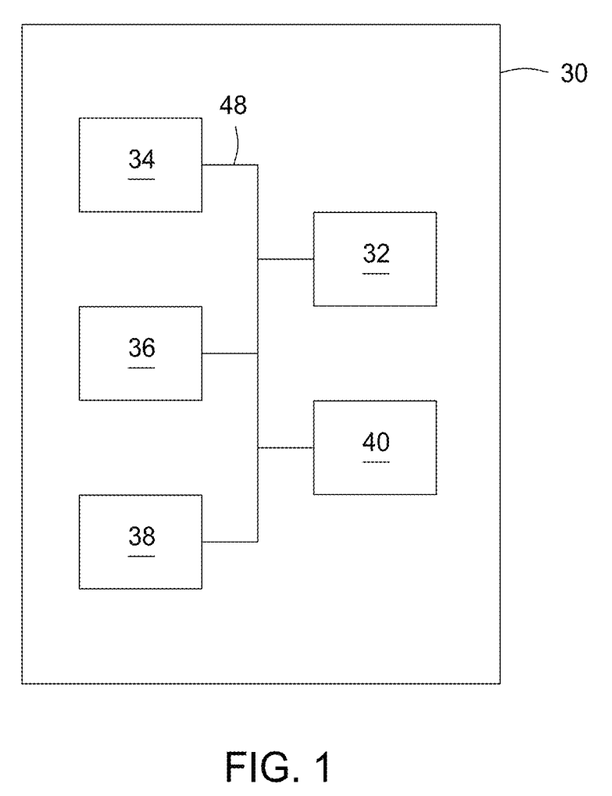
FIG. 1 is a block diagram view of an apparatus for connecting an electric vehicle to a high voltage power source according to an embodiment of the invention.

FIG. 1 is a block diagram view of an apparatus for connecting an electric vehicle to a high voltage power source according to an embodiment of the invention. An EVSE is one such apparatus and may include an input device 32, a memory 34, a communication device 36, a processor 38, and a display 40, some or all of which can be interconnected by a data link 48. The EVSE 30 can be a general computing device, such as a personal computer (PC), a UNIX workstation, a server, a mainframe computer, a personal digital assistant (PDA), a cellular phone, a smartphone, or some combination of these. Alternatively, the EVSE 30 can be a specialized computing device may be constructed of components specifically chosen to execute the functionality of the EVSE 30. The remaining components can include programming code, such as source code, object code or executable code, stored on a computer-readable medium that can be loaded into the memory 34 and processed by the processor 38 in order to perform the desired functions of the EVSE 30.

The processor 38 may be executed in different ways for different embodiments of the EVSE 30. One embodiment is that the processor 38 is a device that can read and process data such as a program instruction stored in the memory 34 or received from a source on the electric vehicle. Such a processor 38 may be embodied by a microcontroller. On the other hand, the processor 38 may be a collection of electrical circuitry components built to interpret certain electrical signals and perform certain tasks in response to those signals, or an integrated circuit.

The memory 34 may include, for example, any form or combination of volatile, non-volatile, solid state, magnetic, optical, permanent, removable, writable, rewriteable, and read-only memory. The memory 34 may contain a number of program instructions for use with the EVSE 30. The instructions may include methods, for example, for controlling the flow of current between the electrical socket and the electric vehicle. These methods may include controlling when to allow or prohibit the flow of current, or perhaps moderate the flow of current. The flow of current can be controlled based on various factors such as when off peak rates of a electrical utility are in progress; the usage of power, for example, within a house, a building, a power grid, or a parking structure; the availability of current or if the current is constant; scheduled power outages; availability of raw materials that are used in generating electricity; the availability of alternative means of generating availability; the weather at the local charging station or outlet, which can effect means of generating electricity, such as wind mills, and solar panels and the like.

The processor 38 and/or memory 34 may include instructions for testing various aspects of the input device 32, communication device 36, processor 38, display 40, or data link 48. In particular, the processor 38 may include structure to test the circuits associated with connecting power between the power source and the vehicle. More specifically, the processor 38 may include structure to test the relay circuits. Moreover, the memory 34 may include instructions for executing a process to test the circuits associated with connecting power between the power source and the vehicle including testing the relay.

Further, the memory may contain software having instructions related to diagnosing vehicle functions, such as OBD-II, battery testing, tire pressure sensor testing, emissions testing and the like. Further, the software may include the ability to track the status of various batteries in the vehicles, such as which batteries have been replaced, the remaining battery life of the various batteries, the warranty information about the batteries, the type of batteries used in the vehicle (mix and match) and the like. Many other embodiments may provide for further methods, some of which will be discussed herein.

Additionally, an embodiment of the EVSE 30 can communicate information to a user through the display 40 and request user input through the input device 32 by way of an interactive, menu-driven, visual display-based user interface, or graphical user interface (GUI). The user may interactively input information using direct manipulation of the GUI. Direct manipulation can include the use of a pointing device, such as a mouse or a stylus, to select from a variety of selectable fields, including selectable menus, drop-down menus, tabs, buttons, bullets, checkboxes, text boxes, and the like. Nevertheless, various embodiments of the invention may incorporate any number of additional functional user interface schemes in place of this interface scheme, with or without the use of a mouse or buttons or keys, including for example, a trackball, a scroll wheel, a touch screen or a voice-activated system.

Some options that may be selected through the input device 32 may allow the user some control over the charging of the electric vehicle. The user may select, for example, that the batteries be charged to or at a certain level or for a certain amount of time, a certain number of charges or start and stop at a certain time or at a particular event. Further, the user may select to be notified on a separate device, like on a cellular device, smart phone, pager, fax, remote control/display, or other wired and wireless devices, that the electric vehicle or charging is in a certain state, such as complete or faulted. The user may be able to set the EVSE to control and power some of the vehicle components while plugged in. For example, during different seasons the user may desire to heat or cool the vehicle as he gets ready for work in the morning so that the vehicle is comfortable when he gets in it. The EVSE may also control setting the radio, power seats and mirrors depending on user preferences. Through the use of the EVSE, other devices like a GPS, radar detector, and other devices that require boot or warm up periods may be powered on before the user enters the electric vehicle.

The display 40 may have a simpler implementation than previously mentioned, consisting of one or multiple indicators. Such indicators may consist of a small liquid crystal display (LCD) that can depict text or graphics. The LCD may be monochrome or colored. Other embodiments may include a single or multiple light emitting diodes (LED). This implementation could work for transmitting a limited number of simple messages. An LED may emit a single color of light, or it may be able to emit a number of different colors. Each LED or color may be associated with a different message. Some messages may include that power is available to charge the electric vehicle batteries, that charging the electric vehicle batteries is in progress, that the charging is complete, and that there is a fault or problem. The display may also be used to indicate the level of charge for the batteries, the number of times the batteries have been charged and the remaining charging time or the time the batteries have been charging.

Figure 2:
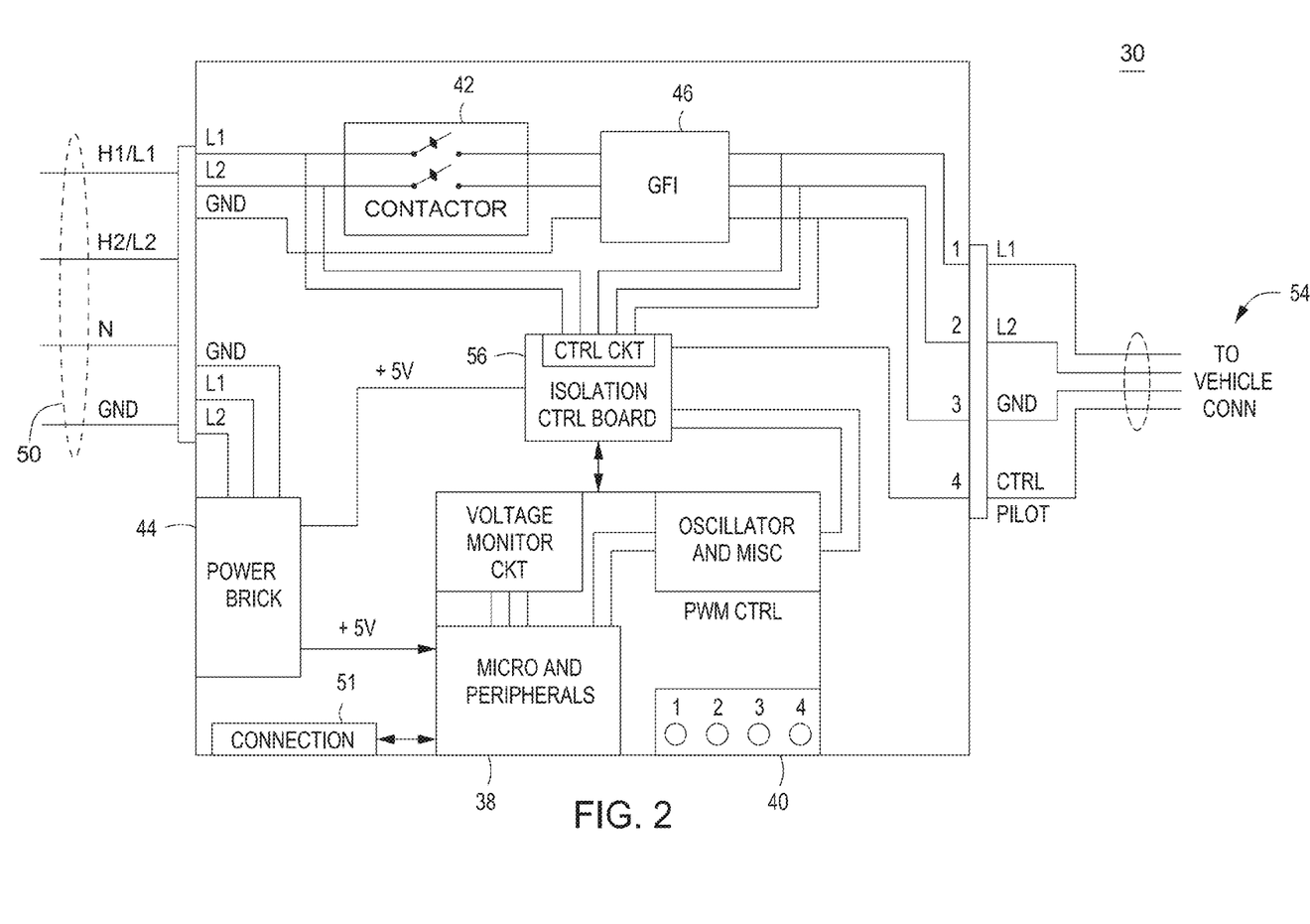
FIG. 2 is a schematic view of an apparatus for connecting an electric vehicle to a high voltage power source according to another embodiment of the invention.

Referring now to FIG. 2, the EVSE 30 may further include a relay 42, a voltage regulating device 44, and a breaking device 46, some or all of which may be connected by an electric conduit 50. A control circuit 56 may act as a buffer between different parts of the EVSE 30. At one end of the EVSE is a socket connector 52 (explained below) and at the other end is the vehicle connector 54 (explained below).

The voltage regulating device 44 may be needed to power the electronic components of the EVSE 30. Since the EVSE 30 may draw its power from the same electrical socket it uses to charge the batteries of the electric vehicle, the EVSE 30 may be receiving high voltage electricity. The electrical socket may supply, for example 220 volts to 240 volts. The high voltage of the power drawn from the electrical socket could damage some of the electronic components of the EVSE 30. Thus, the voltage regulator device 44, such as a transformer or a voltage regulator, may be employed between the electrical socket and the electrical components of the EVSE 30. The voltage may then be lowered to a level that is manageable to the electrical components, such as, for example, 5 volts or 12 volts. In other embodiments, the voltage regulator can increase the voltage as needed by the EVSE 30.

While the voltage regulating device 44 may regulate the voltage to parts of the EVSE 30, there are parts where electricity may flow unaltered from the electrical socket to the electric vehicle. An electric conduit 50 may run the length of the EVSE 30. However, it should not run uninterrupted. A relay 42 may be placed to bridge segments of the electric conduit 50, allowing the EVSE 30 to start and stop the flow of power to the electric vehicle. The electric conduit 50 may optionally be connected to a voltage regulator to step up or step down the voltage passed to the electric vehicle.

Also connected to the electric conduit 50 may be a breaking device 46 (also called a ground device or a current monitor). The breaking device 46 is intended to cut power along the electric conduit 50 quickly so as to avoid harming a user with a high voltage electric shock or harming the components of the EVSE. Such a breaking device 46 may be a ground fault interrupter. If the breaking device 46 trips and cuts power, EVSE 30 may have an auto-reset function to attempt to restore the power transfer to the electric vehicle. The auto-reset function may attempt to restore the power transfer after a determined time or for a determined number of tries. The auto-reset function allows for continuous charging of the vehicle should a power surge occurs while the user is asleep or away from the charging location.

The control circuit 56 may be connected to the electric conduit 50 and to the data link. Acting as a buffer between two portions of the EVSE 30, the control circuit 56 may pass signals from the electric conduit 50 representing the voltage on the electric conduit 50 to the processor 38. From these signals, the processor 38 may react accordingly to control the relay 42 and the breaking device 46. Further, the processor 38, and other components, such as a voltage monitor, an oscillator, and a pulse width modulator may act accordingly to conduct a number of functions of the EVSE 30. The control circuit 56 may also be connected to the voltage control device 44 for power and a control pilot pin of a vehicle connector (discussed below) to pass on signals from the vehicle to other components of the EVSE 30.

More specifically, the control circuit 56 and/or EVSE 30 may include sensor components to sense the various aspects of the EVSE 30 and the electrical conduit 50. The sensor components may sense the voltage, current, or the like on lines L1, L2, and/or ground (GND). The sensor components may also be configured to sense the position of the relay contacts in relay 42. Sensing the position of the relay contacts may include the physical position of the contacts or the flow of power through the relay 42 by sensing the current flowing through the relay 42 or the voltage across the contacts of the relay 42. Similarly, the sensors may sense the status of the ground fault interrupter 46. Of course, other types of physical quantities may be sensed by the sensor components.

The sensor components may forward the values sensed, as noted above, to the control circuit 56. The control circuit 56 may then communicate the sensed values to the microprocessor 38. The microprocessor 38 may then take the appropriate action to allow for normal operation of the EVSE 30, limited operation of the EVSE 30, and/or to stop operation of the EVSE 30.

The microprocessor 38 in conjunction with the memory 34 may also execute testing procedures on the EVSE 30. In particular, the microprocessor 38 and/or executed instructions stored in memory 34 may be configured to test the relay 42, ground fault interrupter 46, or any other aspect of the EVSE 30.

In a particular aspect, the microprocessor 38 and/or instructions stored in memory 34 may test the relay 42 by cycling the relay contacts to ensure the relay contacts are operational. Cycling the relay contacts in the relay 42 includes moving the contacts of relay 42 from an open position to a closed position or, alternatively, moving the contacts of relay 42 from a closed position to an open position. During this cycling test process, the control circuit 56 and microprocessor 38 may monitor the voltage across the contacts of the relay 42 and/or the flow of current across the contacts of relay 42. By monitoring or sensing the flow of current or voltage across the contacts, the microprocessor 38 and control circuit 56 can determine whether the contacts of the relay 42 are operating normally. Additionally or alternatively, the sensor components may sense the physical position of the relay contacts of the relay 42 to determine whether or not the relay 42 is operating normally or not.

In a particular aspect, the cycling test process may include moving the contacts of relay 42 multiple times. By moving the contacts of the relay 42 multiple times this further ensures that the relay 42 of the EVSE 30 is operating normally. In a further aspect, the cycling test process may include opening the contacts and closing the contacts of the relay 42 one or more times. One or more of the opening and closing of the contacts by the control circuit 56 in conjunction with the microprocessor 38 and/or the memory 34 may include sensing an aspect of the contacts of the relay 42 to ensure that each opening or closing of the contacts is performed normally by the relay 42. Moreover, the plural opening and closing of the contacts provides additional assurance that the relay 42 is operating normally. Of course it should be noted that any number of opening and closing of the contacts is a contemplated by the invention.

Figure 4:
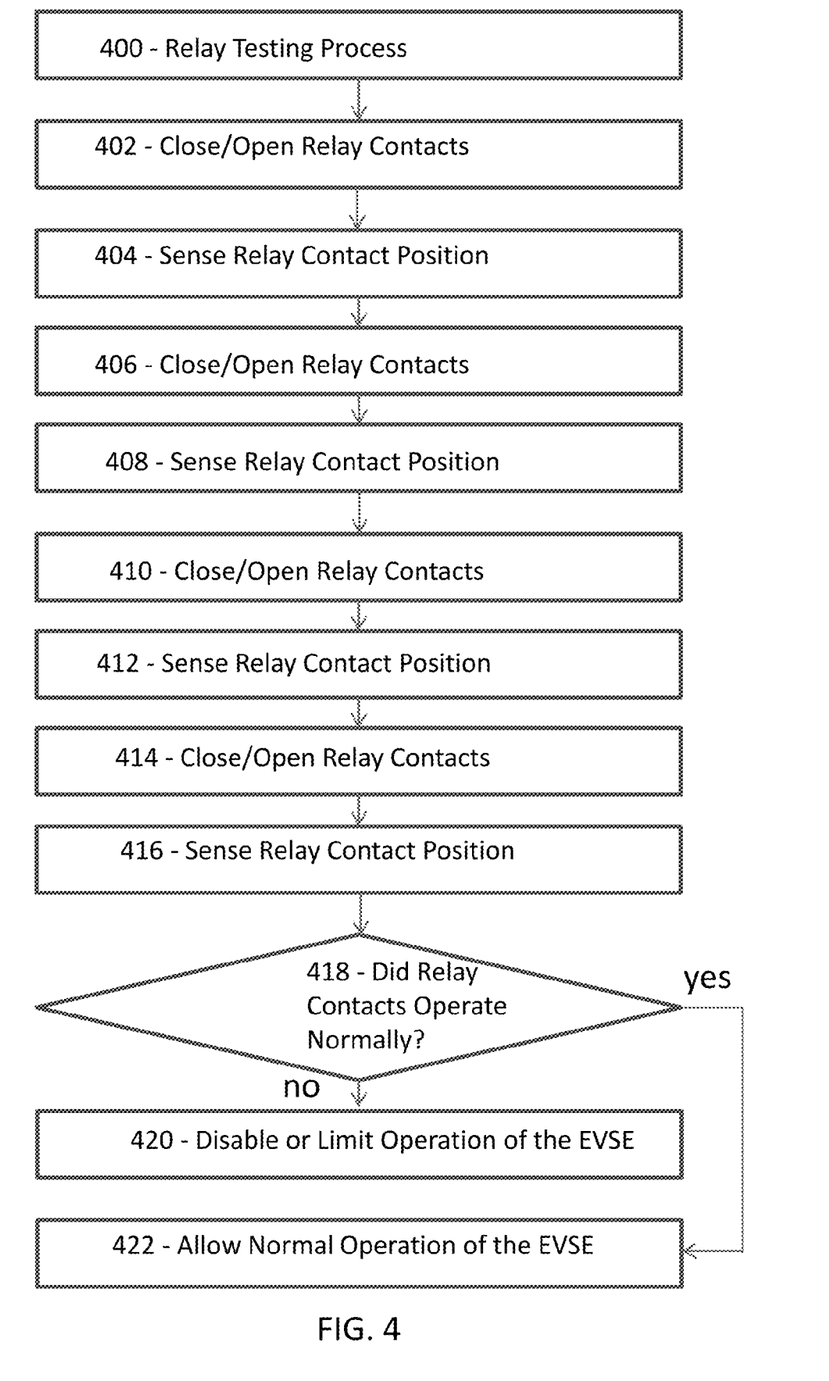
FIG. 4 is a process of testing the circuit of a device for providing a high voltage power source according to another embodiment of the invention.

FIG. 4 is a process of testing the circuit of a device for providing a high voltage power source according to another embodiment of the invention. As shown in FIG. 4, the processor 38 and/or the memory 34 may be configured or include instructions to execute a relay testing process 400. The relay testing process 400 may include opening or closing relay contacts of the relay 42 as shown in 402. In other words, if the relay contacts are opened, they are instructed to be closed; or if the relay contacts are closed they are instructed to be opened. Thereafter, as shown in 404, the relay contact position may be sensed, either physically, based on a current through the relay 42 or a voltage across relay 42. In one aspect, when the contacts are opened and/or closed, an alternating current may be directed across the relay 42 or presumably not directed across the relay 42. A circuit may sense the voltage or lack of voltage that relay 42 provides and count the sinusoidal voltage to determine if the relay 42 is opened or closed. In a particular example, the relay 42 may be closed for 2 seconds and if the voltage is 60 Hz, a counter should count approximately 120 peaks or the like in the voltage of relay 42. Other types of sensing the operation of relay 42 is contemplated as well.

Based on the results of the sensed relay position in 404, it may be determined whether or not the contacts operated normally as shown in 418. If some aspects, if the contacts did not operate normally, then the EVSE may be a disabled or its operation limited as shown in 420. On the other hand, if the sensed operation of the contacts appears normal, then a normal operation of the EVSE may be allowed as shown in a 422.

Additionally, it may be beneficial to cycle the contacts of a relay 42 multiple times. In this regard, the process may be repeated, as shown in 406. Again the relay contacts positions are cycled and their configuration sensed as shown in 408. This process may again be repeated in 410 and 412. This process may be repeated again in 414 and 416. Of course the process may be repeated a fewer or greater number of times. Moreover, the position of the relay 42 does not have to be sensed each time the relays are cycled.

If these additional cycling processes of 406, 408, 410, 412, 414 and 416 are executed, then the process steps 418, 420, and 422 may be implemented as described above to determine whether or not the relay 42 operated normally and to disable, limit, or allow operation of the EVSE accordingly.

The EVSE also may include peripheral connection 51 that can add additional functionality to it, including USB, FireWire, card reader, vehicle connector interface (for OBD-II, and the like connections), CD, DVD, memory, wireless communication, and additional hardware and software. The EVSE's software can be updated via the peripheral connection 51. Additional hardware can be added to include, for example, additional processor, memory, FPGA (field programmable gate array), ASIC, pin connections, multiplexor and the other hardware to expand the functionality of the EVSE.

Figure 3:
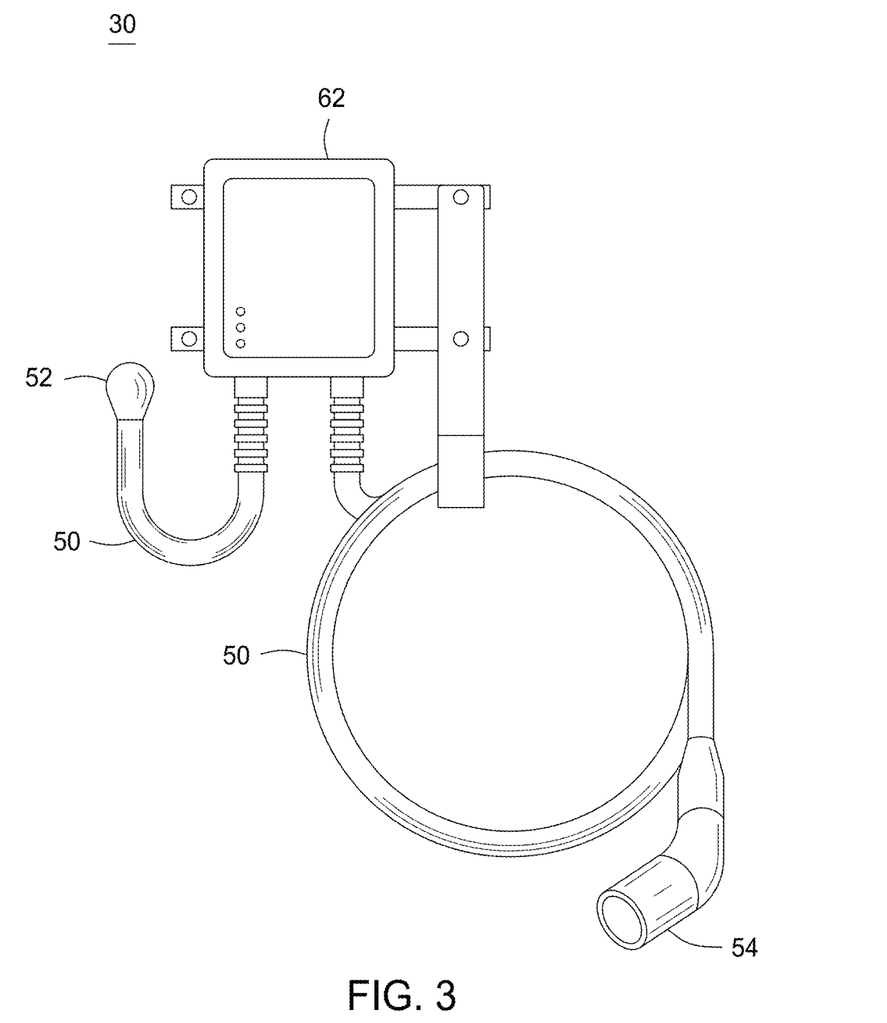
FIG. 3 is an elevation view of an apparatus for connecting an electric vehicle to a high voltage power source according to another embodiment of the invention.

Referring now, to FIG. 3, attached to a respective end of the electric conduit 50 may be the socket connector 52 and the vehicle connector 54. The socket connector 52 may couple with the electrical socket to allow electricity to flow to the EVSE 30. Any of a number of available or proprietary connectors may be used for the socket connector 52. Such available connectors may include a NEMA 14 plug, for example, a NEMA 14-50P plug if appropriate for the electrical socket. Connected to the opposite end of the electric conduit 50 may be the vehicle connector 54, which also may be any number of available or proprietary connectors. One such example of a vehicle connector 54 may be a five-pin connector including two power pins, a ground pin, a control pilot pin, and a proximity sensor pin as specified in the SAE standard J1772 and designed by Yazaki of North America.

In various embodiments, the EVSE 30 can be coupled to a communication network. The communication network allows for communication between the EVSE 30 and a remote device. The EVSE 30 can be coupled to the communication network by way of the communication device 36 which in various embodiments can incorporate any combination of devices—as well as any associated software or firmware—configured to couple processor-based systems. Such communication devices 36 may include modems, network interface cards, serial buses, parallel buses, LAN or WAN interfaces, wired, wireless or optical interfaces, and the like, along with any associated transmission protocols, as may be desired or required by the design.

The communication network links the communication device 36 of the EVSE 30 with the remote device. Various embodiments of the communication network may include any viable combination of devices and systems capable of linking computer-based systems, such as USB; Bluetooth; WiFi; ZigBee; power line communication (PLC); home area network (HAN); Silver Spring network; stable election protocol (SEP); the Internet; TCP/IP; an intranet or extranet; a local area network (LAN); a wide area network (WAN); a direct cable connection; a private network; a public network; an Ethernet-based system; a token ring; a value-added network; a telephony-based system, including, for example, T1 or E1 devices; a cellular telephony system, for example, GPRS or GSM; an Asynchronous Transfer Mode (ATM) network; a wired system; a wireless system; an optical system; a combination of any number of distributed processing networks or systems or the like.

The remote device may be a common remote device, such as a electronic control unit of a vehicle, an example of which often used in vehicles for receiving diagnostic signals such an OBDII signals. The remote device may also be a proprietary remote device, such as one developed for use with a specific brand of engine or specific model of engine. Further embodiments may encompass the remote device being a data receiver for a tire pressure management system. In either of these cases, the communication device 36 may be able to connect with a dealer, manufacturer, service department, government entity such as a state inspection office, etc. and report the findings transmitted from the remote device.

Moreover, the remote device may be a wireless device with a display that gives the user information about the status of the electric vehicle connected to the EVSE 30. The remote device may be such that it is easily placed within a room in a building, or even attached to a key like a key chain. The information delivered to the user may include charge status of the vehicle, diagnostic messages, tire pressure management system messages, and other vehicle related information.

The EVSE 30 may also act as a remote control allowing the user to control function of the car, like power, air conditioning and heat, radio settings, power seat and mirror settings, etc. The EVSE 30 may also have internet access or similar communication access to remote server in order to obtain information such as emails, weather report, web pages, stock information, diagnostic databases and the other information.

The communication device 36 may also be able to communicate with the local utility company. This may allow for the utility company to know that the vehicle in connected and to charge the vehicle at a certain time of the day, such as during off-peak hours, if requested by the user. One embodiment to implement this feature is through the remote device, where the remote device encompasses a smart meter or a computerized utility meter. The EVSE 30 may communicate with the smart meter to determine when the EVSE 30 should charge the vehicle depending on certain parameters. If it is a goal to reduce energy costs, the smart meter may determine at what time of the day the rate for electricity is lowest, and during that time, instruct the EVSE 30 to charge the vehicle. The EVSE 30 may also communicate with the smart meter to indicate when the vehicle is charging and how much charging is required. With this information the smart meter may be able to manage the power consumption of the rest of a house to keep overall power consumption at or below a desired level.

The EVSE 30 may include a housing 62. The housing 62 may encase a number of the components of the EVSE 30, for example, all the components previously mentioned except for portions of the electric conduit 50, the socket connector 52 and the vehicle connector 54. A bracket may be attached to the housing 62 to mount the housing 62 on a vertical surface such as a wall or post. The housing 62 or bracket may further include a hook to hang the power conduit 50. Alternatively, the power conduit may be retractable into the housing 62.

The EVSE 30 may be available for both indoor and outdoor applications. Proper weather proofing may be part of the housing to protect the components from damage and the users from injury. Some outdoor installations of the EVSE 30 may include burial in the ground, being attached to a post, or integrated into a pedestal.

Other embodiments of the EVSE 30 may allow for multiple power conduits 50, each with its own vehicle connector 54. The EVSE 30 may charge the vehicles simultaneously or switch from one vehicle to another after the first vehicle has completed recharging. There may also be an adapter that allows the socket connector to connect to low voltage sockets, such as ones that provide 120 volts or less. In other embodiments, the EVSE 30 can connect to alternative power sources that use renewable energy to charge the vehicle. Such sources may include solar panels and wind turbines, for example. If the alternative power sources alone are insufficient, then they may be supplemented by an electrical socket connected to a utility company source.

As stated above, the EVSE may potentially perform a variety of other functions in addition to its primary purpose of charging the electric vehicle. Multiple embodiments may also include any number of functions that may be considered secondary purposes of the EVSE. A few examples of these functions may include conducting battery tests and reporting the state of the batteries and the number of times the batteries have been charged. The EVSE may also conduct vehicle diagnostics, execute a tire pressure management system, run an emissions analysis, etc.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An apparatus for connecting an electric vehicle to an electrical socket, comprising:
    a socket connector configured to couple with the electrical socket;
    a power conduit connected to the socket connector and configured to convey a voltage from the electrical socket;
    a power control device connected to the power conduit and configured to control a delivery of power through the power conduit, wherein the power control device includes an electrical relay that bridges portions of the power conduit;
    a vehicle connector connected to the power conduit and configured to connect to the electric vehicle;
    a sensor configured to sense voltage, current, or configuration of the power control device, wherein sensing further includes counting a sinusoidal voltage to determine if the electrical relay is opened or closed; and
    a processor configured to test at least the power control device and determine functioning status of the power control device based on an output of the sensor, wherein the processor is configured to test the operation of the electrical relay by actuating the electrical relay multiple times.

2. The apparatus of claim 1, wherein the processor is also configured to test the operation of the electrical relay by sensing a flow of current across a contact of the electrical relay.

3. The apparatus of claim 1, wherein the processor is configured to test the operation of the relay by actuating the electrical relay and sensing a physical position of the electrical relay.

4. The apparatus of claim 3, wherein the processor is configured to allow operation or disable operation of the apparatus based on the test.

5. The apparatus of claim 1, wherein the processor is configured to allow operation or disable operation of the apparatus based on the test.

6. An apparatus for connecting an electric vehicle to a high voltage electrical socket, comprising:
    means for coupling with the high voltage electrical socket;
    means for conveying a current from the high voltage electrical socket that is connected to the means for coupling;

means for controlling current flow or magnitude along the means for conveying the current;

means for interrupting the flow of current to prevent electric shock;

means for connecting to the electric vehicle that is connected to the means for conveying the current, the means for connecting bridges portions of the means for conveying;

means for sensing at least one of voltage, current, or configuration of the means for controlling, wherein means for sensing further counts a sinusoidal voltage to determine if the means for connecting is opened or closed; and means for testing at least the means for connecting and determining functioning status of the means for connecting based on the means for sensing, wherein the means for testing tests the operation of the means for connecting by actuating the means for connecting multiple times.

7. The apparatus of claim 6, wherein the means for interrupting includes an auto-reset function that restores the current flow.

8. The apparatus of claim 6, wherein the means for testing tests the operation of the means for connecting by sensing the flow of current across a contact of the means for connecting.

9. The apparatus of claim 6, wherein the means for testing tests the operation of the means for connecting by actuating the means for connecting and sensing a physical position of the means for connecting.

10. The apparatus of claim 6, wherein the means for testing allows operation or disables operation of the apparatus based on the testing.

11. A method of charging an electrical vehicle, comprising the steps of:

receiving a high electrical voltage from a power source;

conducting the voltage from the power source to the electrical vehicle via a power conduit;

controlling the voltage flowing on the power conduit with a switching relay;

cutting power to the electrical vehicle with a breaker circuit;

sensing at least one of voltage, current, or configuration associated with the switching relay, wherein sensing further includes counting a sinusoidal voltage to determine if the switching relay is opened or closed; and testing the switching relay and determining functioning status of the switching relay based on the sensing, wherein testing tests an operation of the switching relay by actuating the switching relay multiple times.

12. The method of claim 11, wherein testing tests the operation of the switching relay by actuating the switching relay and by sensing the flow of current across a contact of the switching relay.

13. The method of claim 11, further comprising allowing operation or disabling operation of charging based on the test.

* * * * *